(12) United States Patent
    Gleason (10) Patent No.: US 8,964,931 B2
(45) Date of Patent: Feb. 24, 2015

(54) FREQUENCY SCALING COUNTER (71) Applicant: Hewlett-Packard Development Company, L.P., Houston, TX (US)

(72) Inventor: Joseph Daniel Gleason, Rockland, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

(21) Appl. No.: 13/835,529

(22) Filed: Mar. 15, 2013

(65) Prior Publication Data

US 2014/0270049 A1     Sep. 18, 2014

(51) Int. Cl.
    *H03K 21/00*     (2006.01)
    *H03K 21/38*     (2006.01)
(52) U.S. Cl.
    CPC ..................... *H03K 21/38* (2013.01)
    USPC .................. 377/26; 377/44; 377/52
(58) Field of Classification Search
    None
    See application file for complete search history.

(56) References Cited

U.S. PATENT DOCUMENTS

| | | | | |
|---|---|---|---|---|
| 3,924,614 A * | 12/1975 | Segal | ............... | 377/27 |
| 5,450,460 A * | 9/1995 | Stodieck | ............ | 377/44 |
| 5,903,521 A * | 5/1999 | Relph | ............. | 368/113 |
| 6,674,726 B1 | 1/2004 | Kado et al. | | |
| 7,085,341 B2 * | 8/2006 | Wells | ............... | 377/26 |
| 7,551,706 B2 * | 6/2009 | Takagi | ............ | 377/26 |
| 8,189,732 B1 * | 5/2012 | Melton et al. | ........... | 377/26 |
| 8,295,428 B2 | 10/2012 | Hutchings et al. | | |
| 8,693,614 B2 * | 4/2014 | MacKenna et al. | ........... | 377/26 |
| 2008/0258686 A1 | 10/2008 | Li et al. | | |
| 2009/0116610 A1 * | 5/2009 | Gara et al. | ............. | 377/19 |
| 2012/0046912 A1 | 2/2012 | Indukuru et al. | | |
| 2013/0185343 A1 * | 7/2013 | Arad et al. | ............. | 708/200 |
| 2014/0086378 A1 * | 3/2014 | Felten et al. | ............. | 377/44 |

OTHER PUBLICATIONS

Deville, R.A. et al., "Performance Monitoring for Run-time Management of Reconfigurable Devices," (Research Paper), Apr. 21, 2005, pp. 175-181.

* cited by examiner

*Primary Examiner* — Tuan T Lam
(74) *Attorney, Agent, or Firm* — Catherine M. Voisinet; Hewlett-Packard Development Co.

(57) ABSTRACT

A counter is provided, where, as the number of events that occur increases, the frequency in which the events are counted is scaled.

20 Claims, 6 Drawing Sheets

| Exponent | Exponent Counter | Compare Value | Evt_CNT_Inc | Event Counter | EXP_Inc | Description |
|---|---|---|---|---|---|---|
| 0 | 0 | 0 | Y | 0 | | Exponent comparison match. Increase event counter |
| 0 | 0 | 0 | Y | 1 | | Exponent comparison match. Increase event counter |
| 0 | 0 | 0 | Y | 2 | | Exponent comparison match. Increase event counter |
| 0 | 0 | 0 | Y | 3 | Y | Event counter at maximum value, increase exponent |
| 1 | 0 | 1 | | 0 | | |
| 1 | 1 | 1 | Y | 0 | | Exponent comparison match. Increase event counter |
| 1 | 0 | 1 | | 1 | | |
| 1 | 1 | 1 | Y | 1 | | Exponent comparison match. Increase event counter |
| 1 | 0 | 1 | | 2 | | |
| 1 | 1 | 1 | Y | 2 | | Exponent comparison match. Increase event counter |
| 1 | 0 | 1 | | 3 | | |
| 1 | 1 | 1 | Y | 3 | Y | Event counter at maximum value, increase exponent |
| 2 | 0 | 3 | | 0 | | |
| 2 | 1 | 3 | | 0 | | |
| 2 | 2 | 3 | | 0 | | |
| 2 | 3 | 3 | Y | 0 | | Exponent comparison match. Increase event counter |
| 2 | 0 | 3 | | 1 | | |
| 2 | 1 | 3 | | 1 | | |
| 2 | 2 | 3 | | 1 | | |
| 2 | 3 | 3 | Y | 1 | | Exponent comparison match. Increase event counter |
| 2 | 0 | 3 | | 2 | | |
| 2 | 1 | 3 | | 2 | | |
| 2 | 2 | 3 | | 2 | | |
| 2 | 3 | 3 | Y | 2 | | Exponent comparison match. Increase event counter |

FIG. 4A

| Exponent | Exponent Counter | Compare Value | Evt_CNT_Inc | Event Counter | EXP_Inc | Description |
|---|---|---|---|---|---|---|
| 2 | 0 | 3 |  | 3 |  |  |
| 2 | 1 | 3 |  | 3 |  |  |
| 2 | 2 | 3 |  | 3 |  |  |
| 2 | 3 | 3 | Y | 3 | Y | Event counter at maximum value. Increase exponent |
| 3 | 0 | 7 |  | 0 |  |  |
| 3 | 1 | 7 |  | 0 |  |  |
| 3 | 2 | 7 |  | 0 |  |  |
| 3 | 3 | 7 |  | 0 |  |  |
| 3 | 4 | 7 |  | 0 |  |  |
| 3 | 5 | 7 |  | 0 |  |  |
| 3 | 6 | 7 |  | 0 |  |  |
| 3 | 7 | 7 | Y | 0 |  | Exponent comparison match, increase event counter |
| 3 | 0 | 7 |  | 1 |  |  |
| 3 | 1 | 7 |  | 1 |  |  |
| 3 | 2 | 7 |  | 1 |  |  |
| 3 | 3 | 7 |  | 1 |  |  |
| 3 | 4 | 7 |  | 1 |  |  |
| 3 | 5 | 7 |  | 1 |  |  |
| 3 | 6 | 7 |  | 1 |  |  |
| 3 | 7 | 7 | Y | 1 |  | Exponent comparison match, Ir |
| 3 | 0 | 7 |  | 2 |  |  |
| 3 | 1 | 7 |  | 2 |  |  |
| 3 | 2 | 7 |  | 2 |  |  |
| 3 | 3 | 7 |  | 2 |  |  |
| 3 | 4 | 7 |  | 2 |  |  |
| 3 | 5 | 7 |  | 2 |  |  |
| 3 | 6 | 7 |  | 2 |  |  |
| 3 | 7 | 7 | Y | 2 |  | Exponent comparison match, Ir |
| 3 | 0 | 7 |  | 3 |  |  |
| 3 | 1 | 7 |  | 3 |  |  |
| 3 | 2 | 7 |  | 3 |  |  |
| 3 | 3 | 7 |  | 3 |  |  |
| 3 | 4 | 7 |  | 3 |  |  |
| 3 | 5 | 7 |  | 3 |  |  |
| 3 | 6 | 7 |  | 3 |  |  |
| 3 | 7 | 7 | Y | 3 | N | Exponent at maximum value, C |

FREQUENCY SCALING COUNTER

BACKGROUND

Integrated circuits often use counters to monitor the number of occurrences of an event of interest. For example, in an integrated circuit used in a switch or router, counters keep track of certain events, such as the total number of packets processed, the number of packets processed of a particular type, the number of packets processed of a particular length, and any number of other performance metrics. Counters count events, as they occur in a one to one fashion, such that when an event occurs, the counter is incremented.

DETAILED DESCRIPTION

Counters may be used to count events. By counting events as they occur, a variety of metrics can be determined, for example, performance, whether there is a relationship between two interrupts, bandwidth management, assigning priority to ports, etc. However, a problem arises as the number of events that are to be counted increases. The maximum value a typical counter may count to is determined by the number of bits available to the counter to store a counter value. With the addition of each event to be counted, additional circuitry is needed, for example, storage space is needed to store the current value of the counter as the number of events gets large.

However, in certain circumstances, the larger the counter value, the less an administrator may care about the actual count value and the more the administrator would care about whether the count value has reached a particular threshold.

The techniques described herein overcome this problem through the use of a frequency scaling counter. As the number of events increases, the frequency by which the counter is incremented decreases. This provides for the ability for the scaling frequency counter to count to a higher number than a counter that increments once for every event.

The frequency scaling counter discussed herein may have a counter value and an exponent counter value. When the counter value hits a maximum value, the exponent counter value is incremented, and the frequency in which the counter value increments is decreased. Thus, the frequency scaling counter discussed herein may count to a higher count value when compared with a typical counter, where, after a certain number of events, the count value represents a threshold value, rather than an actual count value.

Figure 1:
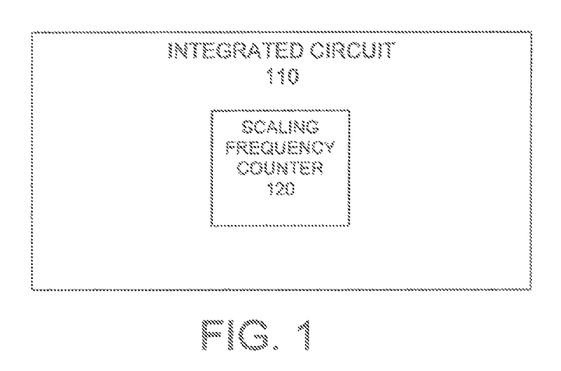
FIG. 1 depicts an example high level block diagram of an integrated circuit incorporating a scaling frequency counter, in accordance with one or more examples of the present disclosure.

FIG. 1 depicts an example high level block diagram of an integrated circuit which utilizes the techniques described herein, according to one or more examples of the present disclosure. Integrated circuit 110 may be an application specific integrated circuit (ASIC) or any other type of integrated circuit. There may be certain events on the integrated circuit that need to be counted. Each event type that is to be counted may be counted by a frequency scaling counter 120.

Figure 2:
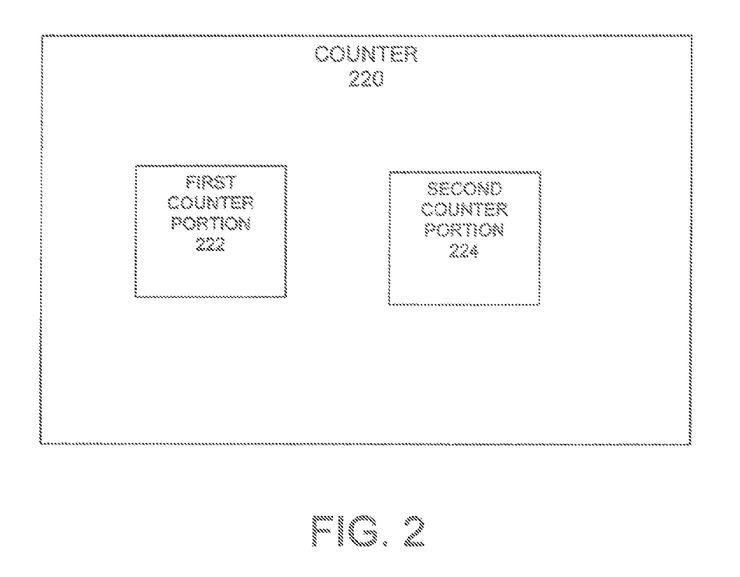
FIG. 2 depicts an example high level block diagram of a counter incorporating a first and second counter portion, in accordance with one or more examples of the present disclosure.

FIG. 2 depicts an example high level block diagram of counter 220, according to one or more examples of the present disclosure. Counter 220 includes a first counting potion 222 and a second counting portion 224. First counting potion 222 increments a count value at a frequency of an event. A second counting portion 224 increments a count value when the first counting portion reaches a maximum value. Thus the increment of the second counting portion is based on the first counting potion. When the second counting portion is incremented, the frequency in which the first counting portion increments a count value is scaled. For example, the frequency in which the first counting portion increments may decrease.

The frequency may decrease according to a predefined scale. For example, where N=a frequency scale, and where EXP=the count value of the second counting portion, the frequency in which the first counting portion increments a count value may be $N^{EXP}$.

Figure 3:
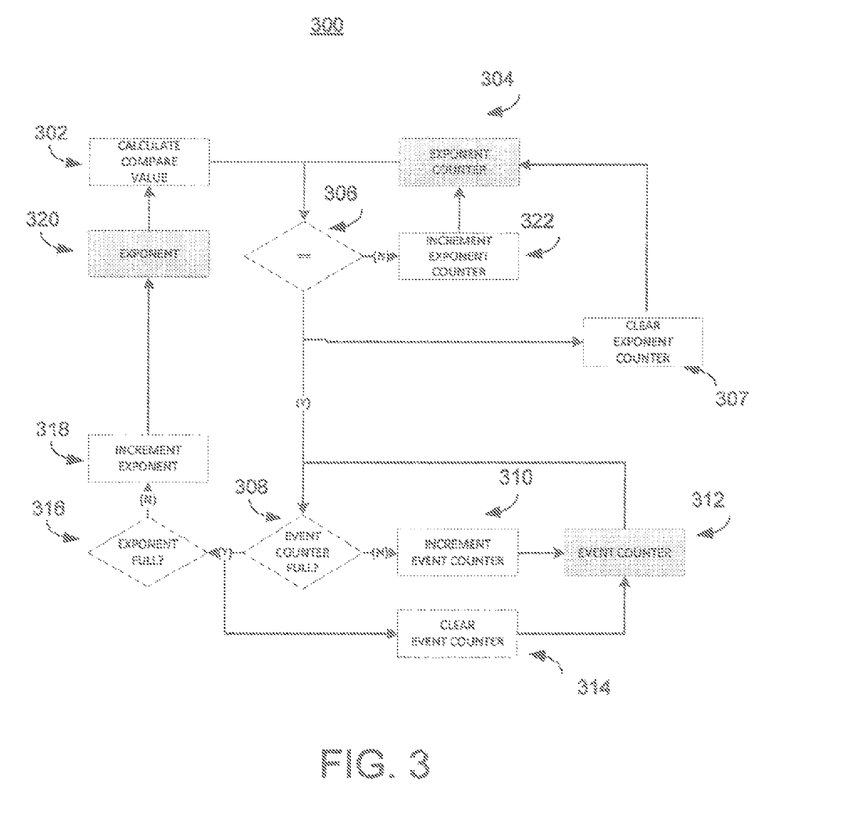
FIG. 3 depicts a block diagram of a frequency scaling counter according to one or more examples of the present disclosure.

FIG. 3 depicts a block diagram of a frequency scaling counter 300 according to one or more embodiments of the present disclosure. The counter depicted in FIG. 3 is an event-driven counter that counts based on events occurring. FIG. 3 utilizes the following:

an event counter that increments, at a frequency, upon event occurrences;

an exponent counter that counts events;

an exponent that increments when the event counter reaches a maximum value; except when the exponent has reached a maximum value;

a compare value that establishes a frequency at which the event counter increments; the compare value may be determined by the following formula, where N=a frequency scale, and where EXP=the count value of an exponent, the compare value may be calculated as follows: $N^{EXP}-1$.

Based on the compare value, the event counter may be incremented every $N^{EXP}$ events.

As shown in FIG. 3, an exponent counter, an exponent, and an event counter are initialized to zero. In the discussion of FIG. 3 following, assume N=2. Further, assume the event counter has a size of 2 bits, and thus may store values of 0 . . . 3. Assume the exponent has a size of 2 bits and thus may store values of 0 . . . 3. In addition, assume that the event being counted is a clock cycle.

As a clock cycle occurs, at block 302, a compare value is calculated. In this example, where the counters have been initialized, the compare value ($2^0-1$) is 0. The compare value is passed to block 306. At block 304, the exponent counter, initialized at 0, is passed to block 306. At block 306, a determination is made as to whether the compare value equals the value of the exponent counter. As both the compare value and the exponent counter are 0, the compare value equals the exponent counter. Thus, at block 306, YES, processing passes to block 307, where the exponent counter is cleared. Processing further passes to block 308. At block 308, a determination is made whether the event counter is full. As the event counter was initialized to 0, the event counter is not full (308, NO) and processing proceeds to block 310. At block 310, the event counter is incremented to 1 and the event counter 312 is passed to block 308, where the counter waits for another event.

When the next clock cycle occurs, at block 302, a compare value is calculated. The compare value is 2^0−1=0. The compare value is passed to block 306. At block 304, the exponent counter, cleared to 0, is passed to block 306. At block 306, a determination is made as to whether the compare value equals the value of the exponent counter. As both the compare value and the exponent counter are 0, the compare value equals the exponent counter. Thus, at block 306, YES, processing passes to block 307, where the exponent counter is cleared. Processing further passes to block 308. At block 308, a determination is made whether the event counter is full. As the event counter was incremented to 1, the event counter is not full (308, NO) and processing proceeds to block 310. At block 310, the event counter is incremented to 2 and the event counter 312 is passed to block 308, where the counter waits for another event.

When the next clock cycle occurs, at block 302, a compare value is calculated. The compare value is 2^0−1=0. The compare value is passed to block 306. At block 304, the exponent counter, cleared to 0, is passed to block 306. At block 306, a determination is made as to whether the compare value equals the value of the exponent counter. As both the compare value and the exponent counter are 0, the compare value equals the exponent counter. Thus, at block 306, YES, processing passes to block 307, where the exponent counter is cleared. Processing further passes to block 308. At block 308, a determination is made whether the event counter is full. As the event counter was incremented to 2, the event counter is not full (308, NO) and processing proceeds to block 310. At block 310, the event counter is incremented to 3 and the event counter 312 is passed to block 308, where the counter waits for another event.

When the next clock cycle occurs, at block 302, a compare value is calculated. The compare value is 2^0−1=0. The compare value is passed to block 306. At block 304, the exponent counter, cleared to 0, is passed to block 306. At block 306, a determination is made as to whether the compare value equals the value of the exponent counter. As both the compare value and the exponent counter are 0, the compare value equals the exponent counter. Thus, at block 306, YES, processing passes to block 307, where the exponent counter is cleared. Processing further passes to block 308. At block 308, a determination is made whether the event counter is full. As the event counter was incremented to 3, the event counter is full (308, YES) and processing proceeds to block 314 where the event counter is cleared. At block 316, a determination is made whether the exponent is full, or has reached a maximum value. If the exponent is not full (316, NO), then the exponent is incremented at block 318. And the exponent value at 320 is passed to block 302 for calculating of the compare value upon receipt of the next event.

When the next clock cycle occurs, at block 302, a compare value is calculated. The compare value is now 2^1−1=1. The compare value is passed to block 306. At block 304, the exponent counter, cleared to 0, is passed to block 306. At block 306, a determination is made as to whether the compare value equals the value of the exponent counter. As the compare value and the exponent counter are not equal, at block 322, the exponent counter is incremented and at block 304, the new exponent counter value is passed to block 306.

When the next clock cycle occurs, at block 302, a compare value is calculated. The compare value is 2^1−1=1. The compare value is passed to block 306. At block 304, the exponent counter is passed to block 306. At block 306, a determination is made as to whether the compare value equals the value of the exponent counter. As the compare value and the exponent counter are equal (306, YES), processing passes to block 307, where the exponent counter is cleared. Processing further passes to block 308. At block 308, a determination is made whether the event counter is full. As the event counter was cleared to 0, at block 308, the event counter is not full (308, NO) and processing proceeds to block 310. At block 310, the event counter is incremented to 1 and the event counter 312 is passed to block 308, where the counter waits for another event.

Events are processed by the counter in this format until the values are provided to an interface (not shown) and the counter reset. As can be seen by the example process noted above, before the exponent was incremented at block 318, every clock cycle was counted by the event counter. When the event counter reached a maximum value, the exponent was incremented, and the frequency in which the event counter counted events thereafter scaled, where every other event was counted by the event counter.

Figure 4A:
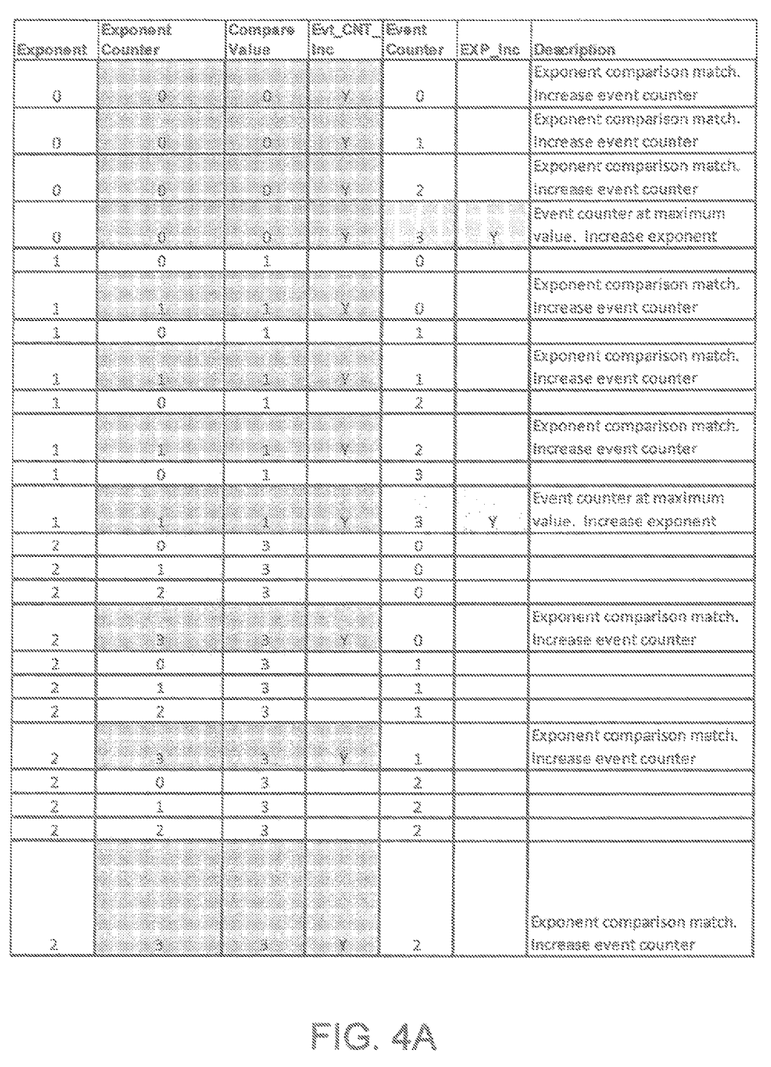
FIGS. 4A-B depict an example of values of components of a frequency scaling counter as the counter operates upon receipt of events.
Figure 4B:
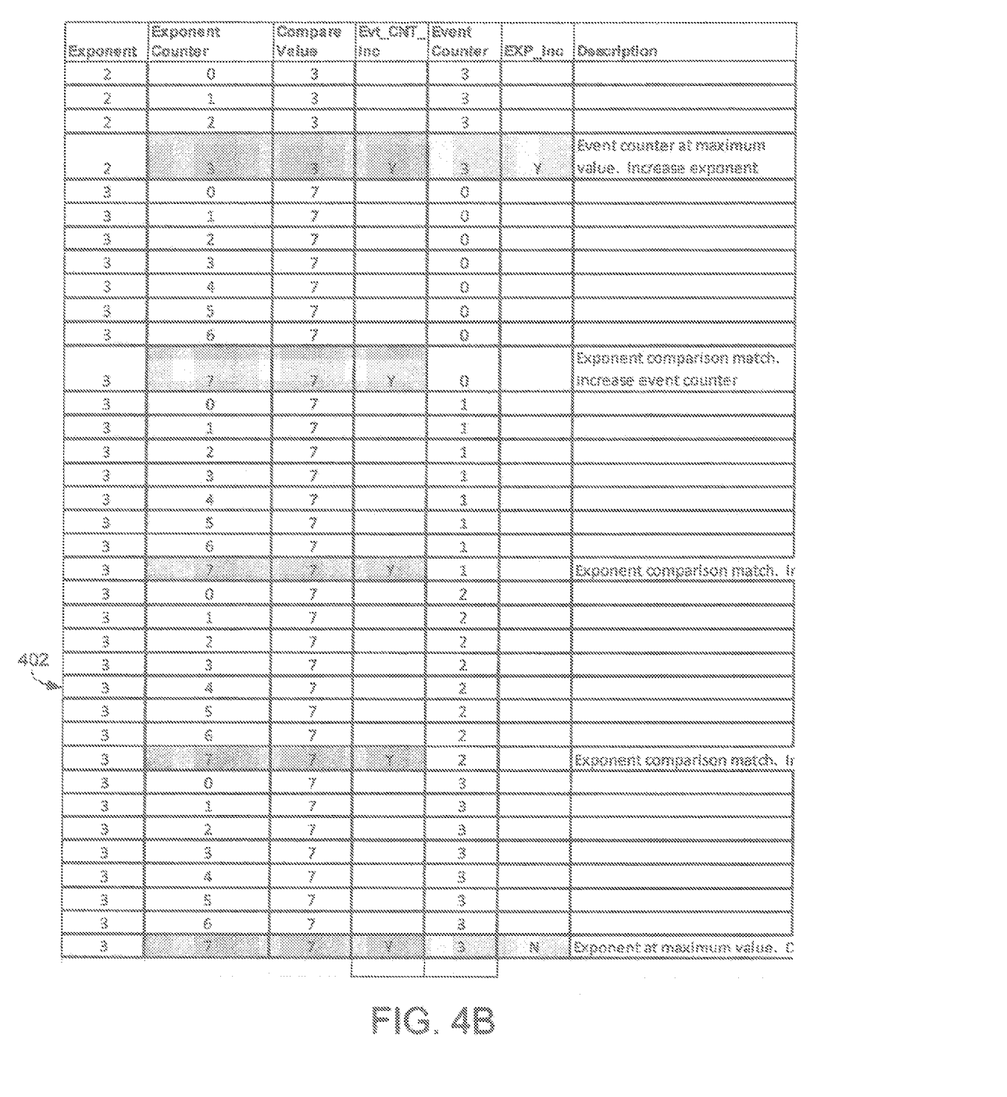

FIGS. 4A-4B depict a table tracking the exponent value, exponent counter, exponent compare value, the event counter increment, the event counter, the exponent increment, and a description. Each line in the table represents how the frequency scaling counter, and the specific components therein, of FIG. 3 change. The description noted above described the first five lines in the table. As the clock continues to cycle, the exponent, exponent compare value, and the event counter, increment as indicated in the tables of FIGS. 4A-4B. The table depicted in FIG. 4B is a continuation of the table depicted in FIG. 4A.

As can be seen from the tables in FIGS. 4A-4B, a 4-bit counter may count up to 60 events, as compared to a typical 4-bit counter that increments every event that only counts to 15.

By providing for the opportunity to increment an exponent, where the exponent adjusts the compare value, a frequency in which the counter counts events scales. This permits the counter to count to a higher value. In exchange for being able to count more events, the higher the scaling frequency counts, the less accurate the actual count value is. For example, at line 402 in FIG. 4B, the frequency scaling counter has received 49 clock cycles. The exponent value is 3, and the event counter is 2. At this stage in the counter, the frequency in which the event counter increments is 2^3, or every 8 clock cycles. Thus, the scaling frequency counter only provides a threshold, namely 44. The actual count value of 49 may not be determined based on the output of the scaling frequency counter.

It may be appreciated additional values within the scaling frequency counter may be output in order to calculate the actual scaling frequency counter value. For example, the exponent value and the event counter value may be utilized in conjunction with the scaling formula to calculate the threshold value. In addition, the exponent counter value may be output to calculate the actual scaling frequency counter value.

Figure 5:
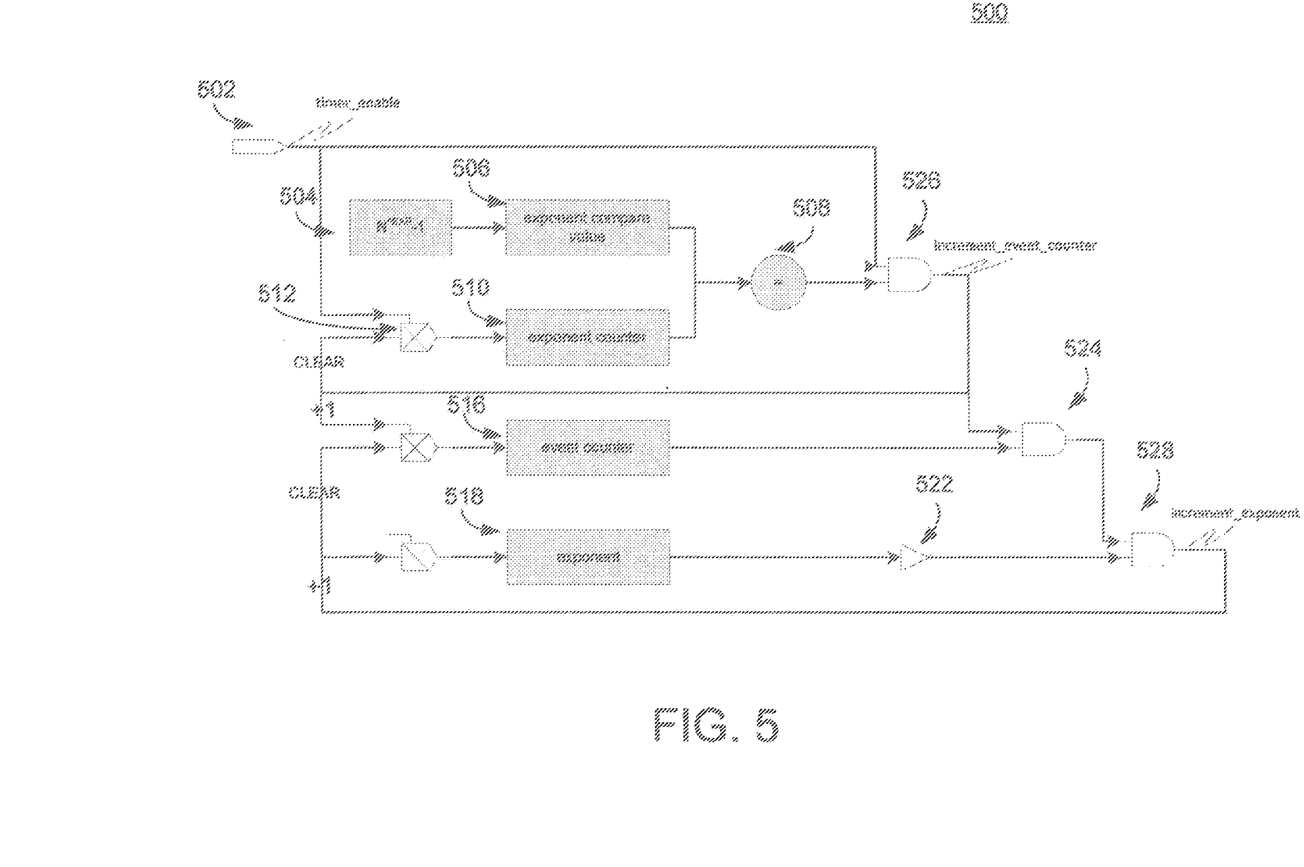
FIG. 5 depicts a hardware diagram of an example scaling frequency counter, in accordance with one or more examples of the present disclosure.

FIG. 5 depicts a hardware diagram of an example scaling frequency counter 500 in accordance with some implementations of the present disclosure. As can be seen in FIG. 5, input signal 502 is an input to the frequency scaling counter. As shown in FIG. 5, input signal 502 is a timer enable signal. However, it may be appreciated that other signals may be input to the frequency scaling counter 500, including enable port, clear, etc.

Block 504 is used to generate the exponent compare value via the formula N^EXP−1 at block 518. Exponent compare value 506, (calculated based on the formula: N^EXP−1 as noted above) is compared with the exponent counter 510 at 508. The result of the comparison and the input timer enable signal are input to AND gate 526. When both the result of the comparison and the input timer enable signal are HIGH, the event counter is incremented, and the output of the AND gate 526 is input to AND gate 524 together with the event counter. The output of the AND gate 526 is input into MUX 512 to clear the exponent counter value. This signal is multiplexed with the timer enable signal 502 and input to exponent counter value 510. In addition, the output of the AND gate 526 is input into MUX 514 to increment the event counter.

When the event counter is full and the AND gate is HIGH, AND gate 524 outputs HIGH to AND gate 528. Exponent 518 is input to NOT gate 522 and the output of NOT gate 522 is fed to AND gate 528. When both input signals are HIGH at AND gate 528, the exponent is incremented.

It may be appreciated that additional components may be included in frequency scaling counter 600. For example, additional signals may be utilized to ensure the exponent 518 does not overflow.

Figure 6:
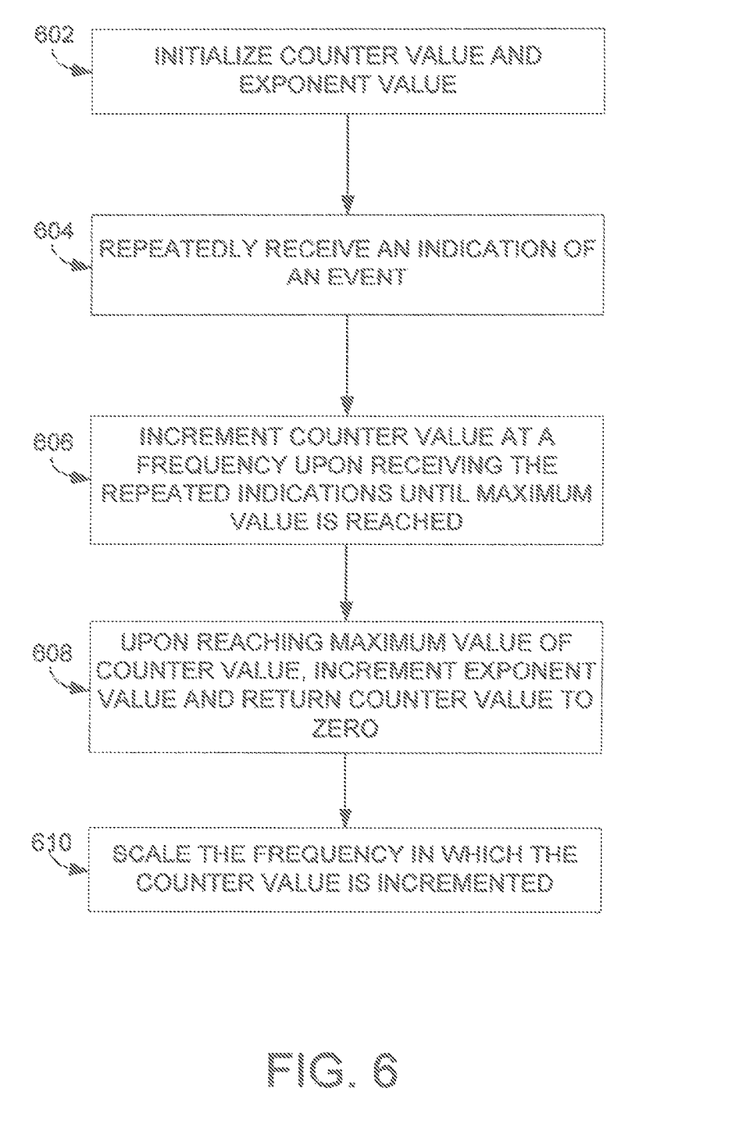
FIG. 6 is an example of a flow diagram for incrementing a frequency scaling counter, in accordance with one or more examples of the present disclosure. counter to memory.

FIG. 6 depicts an example flow diagram of the process 600 for frequency scale counting. As shown in FIG. 6, a counter value and an exponent value are initialized at 602.

At block 604, the counter repeatedly received an indication of an event.

The event may be a timer event, for example, a clock cycle, an external event, etc.

At block 606, the counter value is incremented at a frequency upon receiving repeated indications until a maximum count value of the counter value is reached. The frequency may be determined based on a counter value and defined as for example, where N=a frequency scale, and where EXP=the count value of the second counting portion, the frequency may be N^EXP.

At block 608, upon reaching the maximum value of the counter value, an exponent value is incremented and the counter value is cleared to zero.

At block 610, the frequency in which the counter value is incremented is scaled.

It may be appreciated that one or more examples of the frequency scaling counter discussed herein includes circuitry to output at least the exponent value and the counter value. By knowing the frequency scale N, the exponent value and the counter value, the last threshold met by the frequency scaling counter may be calculated.

It may be appreciated that the frequency scaling counter discussed herein may be utilized in a variety of computing devices, for example, networking infrastructure devices such as switches, routers, etc. The frequency scaling counter discussed herein may be useful in a variety of situations where, for example, an administrator may need to know if a certain threshold has been met by the counter.

I claim:

1. A method, comprising:
   initializing an event counter and an exponent value;
   for each successive receipt of an event, iteratively performing, by an integrated circuit:
      computing a compare value based on the exponent value;
      comparing the compare value to a value of an exponent counter;
      in response to the comparing indicating a condition is satisfied,
         incrementing the event counter in response to receipt of the event and the event counter not reaching a target value; and
         incrementing the exponent value and returning the event counter to an initial value in response to the event counter reaching the target value.

2. The method of claim 1, where N is a non-zero integer and EXP is the exponent value, and where the event counter is incremented every $N^{EXP}$ event receipts until the event counter has reached the target value, and wherein the compare value is $N^{EXP}-1$.

3. The method of claim 1, further comprising:
   outputting the exponent value and a value of the event counter.

4. The method of claim 1, wherein the event is a clock cycle.

5. The method of claim 1, wherein the event is an external event.

6. The method of claim 1, further comprising:
   incrementing the exponent counter in response to receipt of the event and the comparing indicating that the condition is not satisfied.

7. The method of claim 6, further comprising resetting the exponent counter in response to the comparing indicating that the condition is satisfied.

8. The method of claim 6, wherein the condition is satisfied responsive to the compare value being equal to the value of the exponent counter.

9. The method of claim 1, wherein incrementing the event counter is further based on a condition that the event counter has not reached the target value.

10. The method of claim 1, wherein iteratively performing the incrementing of the event counter and the incrementing of the exponent value causes scaling of a frequency at which the event counter is incremented as the exponent value is incremented.

11. An integrated circuit, comprising:
   a frequency scaling counter to, for each successive receipt of an event, iteratively perform:
      computing a compare value based on an exponent value;
      comparing the compare value to a value of an exponent counter;
      in response to the comparing indicating a condition is satisfied,
         incrementing an event counter in response to receipt of the event and the event counter not reaching a target value; and
         incrementing the exponent value and returning the event counter to an initial value in response to the event counter reaching the target value.

12. A frequency scaling counter, comprising:
   a circuit to, for each successive receipt of an event, iteratively perform:
      computing a compare value based on an exponent value;
      comparing the compare value to a value of an exponent counter;
      in response to the comparing indicating a condition is satisfied,
         incrementing an event counter in response to receipt of the event and the event counter not reaching a target value; and
         incrementing the exponent value and returning the event counter to an initial value in response to the event counter reaching the target value.

13. The frequency scaling counter of claim 12, further comprising:
   an input clock signal, wherein a frequency of the event is based on the input clock signal.

14. The frequency scaling counter of claim 12, further comprising:

an interface to output a value of the event counter and the exponent value.

15. The frequency scaling counter of claim 12, wherein the circuit is to further increment the exponent counter in response to receipt of the event and the comparing indicating that the condition is not satisfied.

16. The frequency scaling counter of claim 12, wherein the condition is satisfied responsive to the compare value being equal to the value of the exponent counter.

17. The frequency scaling counter of claim 12, wherein the incrementing of the event counter is further based on a condition that the event counter has not reached the target value.

18. The frequency scaling counter of claim 12, wherein the target value is a maximum value of the event counter.

19. The frequency scaling counter of claim 12, where N is a non-zero integer, EXP is the exponent value, and the compare value is $N^{EXP}-1$.

20. The frequency scaling counter of claim 19, wherein the event counter is incremented every $N^{EXP}$ event receipts until the event counter has reached the target value.

* * * * *

UNITED STATES PATENT AND TRADEMARK OFFICE
CERTIFICATE OF CORRECTION

PATENT NO. : 8,964,931 B2  Page 1 of 1
APPLICATION NO. : 13/835529
DATED : February 24, 2015
INVENTOR(S) : Joseph Daniel Gleason It is certified that error appears in the above-identified patent and that said Letters Patent is hereby corrected as shown below:

In the Claims

In column 6, line 6, in Claim 2, delete "$N^{\wedge EXP}$" and insert -- $N^{\wedge}EXP$ --, therefor.

In column 6, line 8, in Claim 2, delete "$N^{\wedge EXP}-1$" and insert -- $N^{\wedge}EXP-1$ --, therefor.

In column 7, line 17, in Claim 19, delete "$N^{\wedge EXP}-1$" and insert -- $N^{\wedge}EXP-1$ --, therefor.

In column 7, line 19, in Claim 20, delete "$N^{\wedge EXP}$" and insert -- $N^{\wedge}EXP$ --, therefor.

Signed and Sealed this
Thirtieth Day of June, 2015

Michelle K. Lee
*Director of the United States Patent and Trademark Office*